(12) United States Patent
Song et al.

(10) Patent No.: US 11,233,449 B2
(45) Date of Patent: Jan. 25, 2022

(54) TAPPED SINGLE-STAGE BUCK CONVERTER LED DRIVER

(71) Applicant: Lumileds LLC, San Jose, CA (US)

(72) Inventors: Zhi Hua Song, San Jose, CA (US); Wouter Soer, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/906,797

(22) Filed: Feb. 27, 2018

(65) Prior Publication Data

US 2019/0268983 A1    Aug. 29, 2019

(51) Int. Cl.

| | |
|---|---|
| *H02M 7/06* | (2006.01) |
| *H02M 3/156* | (2006.01) |
| *H02M 1/08* | (2006.01) |
| *H02M 1/24* | (2006.01) |
| *H05B 45/48* | (2020.01) |
| *H02M 1/12* | (2006.01) |
| *H05B 45/375* | (2020.01) |
| *H03K 5/24* | (2006.01) |
| *H02M 1/44* | (2007.01) |
| *H05B 45/355* | (2020.01) |
| *H05B 45/36* | (2020.01) |
| *H02M 1/00* | (2006.01) |
| *H02M 1/42* | (2007.01) |

(52) U.S. Cl.
CPC ............ *H02M 1/12* (2013.01); *H02M 1/08* (2013.01); *H02M 7/06* (2013.01); *H05B 45/375* (2020.01); *H02M 1/0048* (2021.05); *H02M 1/4291* (2021.05); *H02M 1/44* (2013.01); *H03K 5/24* (2013.01); *H05B 45/355* (2020.01); *H05B 45/36* (2020.01)

(58) Field of Classification Search
CPC ...................................................... H03K 5/24
See application file for complete search history.

(56) References Cited

U.S. PATENT DOCUMENTS

| | | | |
|---|---|---|---|
| 7,863,831 B2 | 1/2011 | Vos | |
| 8,324,840 B2 | 12/2012 | Shteynberg et al. | |
| 8,963,431 B2 | 2/2015 | van den Berg et al. | |
| 9,265,114 B2* | 2/2016 | Palmer | H05B 45/20 |
| 9,271,345 B2* | 2/2016 | Welten | H05B 45/395 |
| 9,332,605 B2* | 5/2016 | Nederbragt | H05B 33/083 |
| 9,967,933 B2* | 5/2018 | Reed | H05B 45/46 |
| 2011/0210674 A1* | 9/2011 | Melanson | H05B 33/0815 |
| | | | 315/185 R |
| 2014/0103813 A1 | 4/2014 | Moss | |

(Continued)

*Primary Examiner* — Anh Q Tran
(74) *Attorney, Agent, or Firm* — Volpe Koenig (57) ABSTRACT

An apparatus is disclosed, comprising: a first light source having a first threshold voltage; a second light source having a second threshold voltage; a rectifier configured to receive an AC voltage as input and generate a DC voltage based on the AC voltage; a single-stage Buck converter section coupled to the rectifier, the first light source, and the second light source, the Buck converter section being configured to output a current generated based on the DC voltage towards the first light source and the second light source; and a switching circuit configured to reduce a load on the Buck converter section by periodically diverting the current away from the second light source when a magnitude of the AC voltage is less than or equal to a sum of the first threshold voltage and the second threshold voltage.

12 Claims, 7 Drawing Sheets

(56) References Cited

U.S. PATENT DOCUMENTS

| | | | |
|---|---|---|---|
| 2014/0139125 A1* | 5/2014 | Lee | H05B 45/44 |
| | | | 315/186 |
| 2014/0210357 A1* | 7/2014 | Yan | H05B 33/0824 |
| | | | 315/186 |
| 2015/0108909 A1* | 4/2015 | Rupp | H05B 33/083 |
| | | | 315/188 |
| 2015/0123568 A1 | 5/2015 | Yang et al. | |
| 2016/0353535 A1* | 12/2016 | Arulandu | H05B 45/37 |
| 2016/0374166 A1* | 12/2016 | Chen | H05B 33/083 |
| 2018/0092179 A1 | 3/2018 | Guo et al. | |
| 2018/0220502 A1* | 8/2018 | Morales | F21K 9/238 |

\* cited by examiner

TAPPED SINGLE-STAGE BUCK CONVERTER LED DRIVER

FIELD OF INVENTION

The present disclosure relates to light emitting devices in general, and more particularly, to a tapped single-stage Buck converter LED driver.

BACKGROUND

Light emitting diodes ("LEDs") are commonly used as light sources in various applications. LEDs are more energy-efficient than traditional light sources, providing much higher energy conversion efficiency than incandescent lamps and fluorescent light, for example. Furthermore, LEDs radiate less heat into illuminated regions and afford a greater breadth of control over brightness, emission color and spectrum than traditional light sources. These characteristics make LEDs an excellent choice for various lighting applications ranging from indoor illumination to automotive lighting. Accordingly, the need exists for improved LED-based illumination systems that harness the advantages of LEDs to provide high-quality illumina020on.

SUMMARY

An apparatus comprises: a first light source having a first threshold voltage, the first threshold voltage being a minimum voltage required to be supplied to the first light source in order for the first light source to be turned on; a second light source having a second threshold voltage, the second threshold voltage being a minimum voltage required to be supplied to the second light source in order for the second light source to be turned on; a rectifier configured to receive an AC voltage as input and generate DC voltage based on the AC voltage; a single-stage Buck converter section coupled to the rectifier, the first light source, and the second light source, the Buck converter section being configured to output a current generated based on the DC voltage towards the first light source and the second light source; and a switching circuit configured to reduce a load on the Buck converter section by periodically diverting the current away from the second light source when a magnitude of the AC voltage is less than or equal to a sum of the first threshold voltage and the second threshold voltage.

According to aspects of the disclosure, an apparatus is disclosed that is powered with AC voltage supplied by an AC source, the apparatus comprising: a first light source having a first threshold voltage; a second light source having a second threshold voltage, the second light source being coupled in series with the first light source; a single-stage Buck converter section coupled in series with the first light source and the second light source, the Buck converter section being arranged to output current towards the first light source and the second light source; and a switching circuit configured to periodically reduce a load placed on the Buck converter section by diverting the current away from the second light source, when a magnitude of the AC voltage is less than or equal to a sum of the first threshold voltage and the second threshold voltage.

According to aspects of the disclosure, an apparatus is disclosed that is powered with AC voltage supplied by an AC source, the apparatus comprising: a first light source having a first threshold voltage; a second light source having a second threshold voltage, the second light source being coupled in series with the first light source; a single-stage Buck converter section coupled in series with the first light source and the second light source, the Buck converter section being arranged to power the first light source and the second light source; and a switching circuit configured to periodically reduce a load that is placed on the Buck converter section by periodically closing a short conductive path that is coupled in series with the first light source and runs in parallel with the second light source, when a magnitude of the AC voltage is less than or equal to a sum of the first threshold voltage and the second threshold voltage.

BRIEF DESCRIPTION OF THE DRAWINGS

The drawings described below are for illustration purposes only. The drawings are not intended to limit the scope of the present disclosure. Like reference characters shown in the figures designate the same parts in the various embodiments.

DETAILED DESCRIPTION

According to aspects of the disclosure, an LED driver is disclosed for driving a plurality of light sources. The LED driver may include a Buck converter circuit (e.g., a Buck converter section) and a tapped stage that reduces the amount of total harmonic distortion (THD) produced by the Buck converter circuit. The tapped stage may be configured to divide the light sources into sections. In operation, the tapped stage may switch each section on and off based on the magnitude of instantaneous voltage that is supplied to the LED driver. When the instantaneous voltage is too low to power all sections of light sources, one or more of the sections of light sources may be switched off. When the sections of light sources are switched off, the load that is placed on the Buck converter circuit may decrease. This may prevent the Buck converter circuit from becoming switched off and cause the Buck converter circuit to remain switched on for longer time periods. As a result, the amount of THD that is normally generated during periods when the Buck converter circuit is switched off may also decrease.

Examples of various LED drivers will be described more fully hereinafter with reference to the accompanying drawings. These examples are not mutually exclusive, and features found in one example can be combined with features found in one or more other examples to achieve additional implementations. Accordingly, it will be understood that the examples shown in the accompanying drawings are provided for illustrative purposes only, and they are not intended to limit the disclosure in any way. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Figure 1:
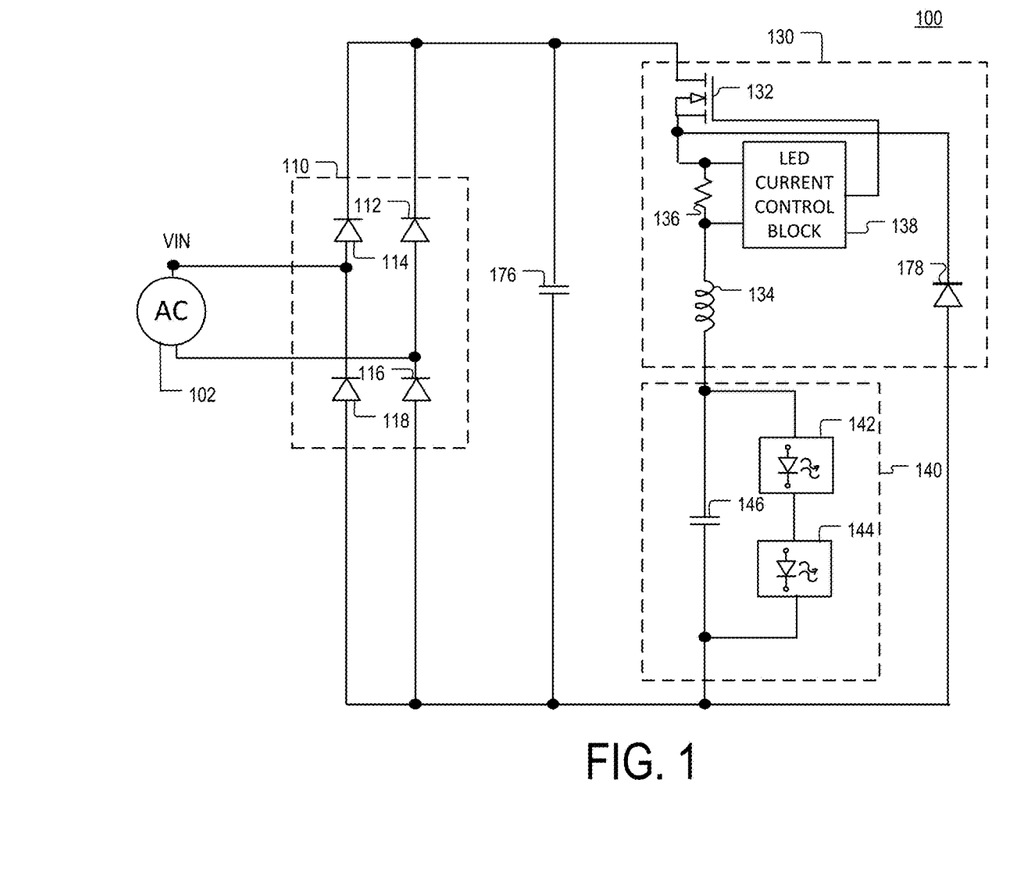
FIG. 1 is a diagram of an example of an LED driver circuit, in accordance with the present disclosure.

FIG. 1 is a diagram of an example of an LED driver 100, according to aspects of the disclosure. The LED driver 100 may include a rectifier 110 which is arranged to receive AC voltage VIN from an AC source 102 and supply rectified DC voltage to a Buck converter section 130. The AC source 102 may include a municipal power main and/or any other suitable source of AC current. The rectifier 110 may include any suitable type of rectifier circuit. In some implementations, the rectifier 110 may include diodes 112, 114, 116, and 118, arranged as shown.

The Buck converter section 130 may be a single-stage Buck converter. The Buck converter section 130 may include a metal oxide-semiconductor field effect transistor (MOSFET) 132, an inductor 134, a resistor 136, a current control block 138, and a diode 178. The current control block 138 may be coupled to the gate of the MOSFET 132 as shown. The current control block 138 may be configured to intermittently turn the MOSFET 132 on and off in accordance with a predetermined frequency. When the MOSFET 132 is turned on, current flows through the inductor 134. During this period, the inductor 134 builds up its magnetic energy. When the MOSFET 132 is turned off, the inductor 134 releases the magnetic energy to supply current to the load section 140 through the diode 178. The current supplied to the load section 140 can be regulated to required levels by varying the switching pattern of the MOSFET 132 by using the current control block 138. The current ripples due to high-frequency switching can be largely absorbed by capacitor 176 such that most of the ripples do not reach the AC input side and cause electromagnetic compatibility (EMC) issues.

The load section 140 may include the light source 142, the light source 144, and a capacitor 146 that is coupled in parallel with the light sources 142 and 144 to largely absorb high frequency current ripples. The light source 142 may include one or more LEDs. In some implementations, at least some of the LEDs in the light source 142 may be coupled to one another in series. Additionally or alternatively, in some implementations, at least some of the LEDs in the light source 142 may be coupled to one another in parallel.

The light source 144 may include one or more LEDs. In some implementations, at least some of the LEDs in the light source 144 may be coupled to one another in series. Additionally or alternatively, in some implementations, at least some of the LEDs in the light source 144 may be coupled to one another in parallel. In some implementations, the light source 142 may have a threshold voltage of VLED1 (e.g., 30V) and the light source 144 may have a threshold voltage VLED2 (e.g., 30V). The load section 140 may have a combined threshold voltage that is equal to the sum of VLED1 and VLED2 (e.g., 60V).

As used throughout the disclosure, the term "threshold voltage" shall refer to the minimum voltage that needs to be applied across a light source (or an LED) in order for the light source (or LED) to be turned on. By way of example, a light source (or an LED) may be considered turned on if the light source (or LED) conducts current. As another example, a light source (or an LED) may be considered turned on if the light source (or LED) emits light.

In the example of FIG. 1, the LED driver 100 has two primary functions. The first function is a power factor correction (PFC) function, which involves controlling the quality of input current. The second function is an LED current regulation function, which involves controlling the amount of current that reaches the load section 140. The PFC function is particularly challenging for the LED driver 100 because the voltage output by the Buck converter section 130 is necessarily lower than the voltage that is input into the Buck converter section. Therefore, in a single stage AC input configuration, the Buck converter section 130 may only conduct current when the rectified instantaneous AC voltage VIN that is supplied by the AC source 102 is greater than the threshold voltage of the load section 140. In other words, during periods in which the instantaneous AC voltage VIN is lower than the threshold voltage of the load section 140, the Buck converter section 130 would not conduct. Periods during which the Buck converter section 130 does not conduct may be referred to as "interruption periods."

Figure 2:
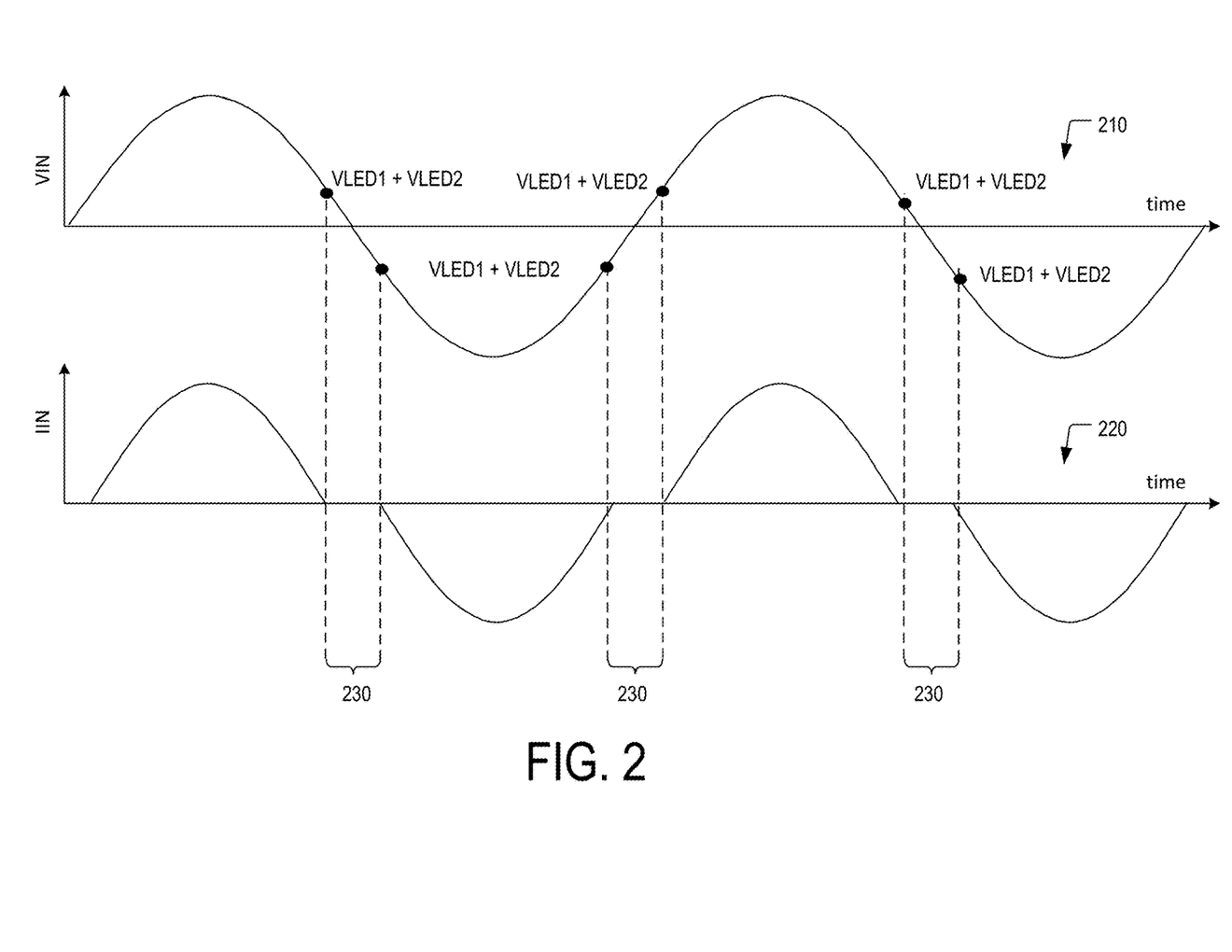
FIG. 2 is graph illustrating aspects of the operation of the LED driver circuit of FIG. 1, in accordance with the present disclosure.

FIG. 2 includes plots 210 and 220 which illustrate a pattern at which interruption periods occur during the normal operation of the LED driver 100. Plot 210 shows the input AC voltage VIN, which is supplied to the LED driver 100 by the AC source 102, as a function of time. Plot 220 shows the input current IIN that is supplied to the LED driver 100 by the AC source 102. As illustrated by the plot 220, the flow of the input current IIN is interrupted during interruption periods 230. During the interruption periods 230, the value of the current IIN is zero or close to zero. The interruption periods 230 may occur at times when the magnitude of the input AC voltage VIN is less than the threshold voltage of the load section 140 (VLED1+VLED2).

The interruption periods 230 of the LED driver 100 may be characterized by an elevated concentration of harmonic components, which can result in the individual and total harmonic components of the input current IIN failing to meet legal requirements. Moreover, the elevated concentrations of harmonic components can lead to compromised circuit performance that renders impractical the use of Buck converter sections to drive LED-based light sources.

The occurrence of interruption periods when single-stage Buck converters are used to power LEDs cannot be avoided, as single stage Buck converters, by definition, must have an input voltage that is always higher than the converters's output voltage (i.e., a positive voltage differential). However, as is discussed further below, the undesirable effects of the interruption periods can be mitigated by using additional circuitry to reduce their duration.

Figure 3:
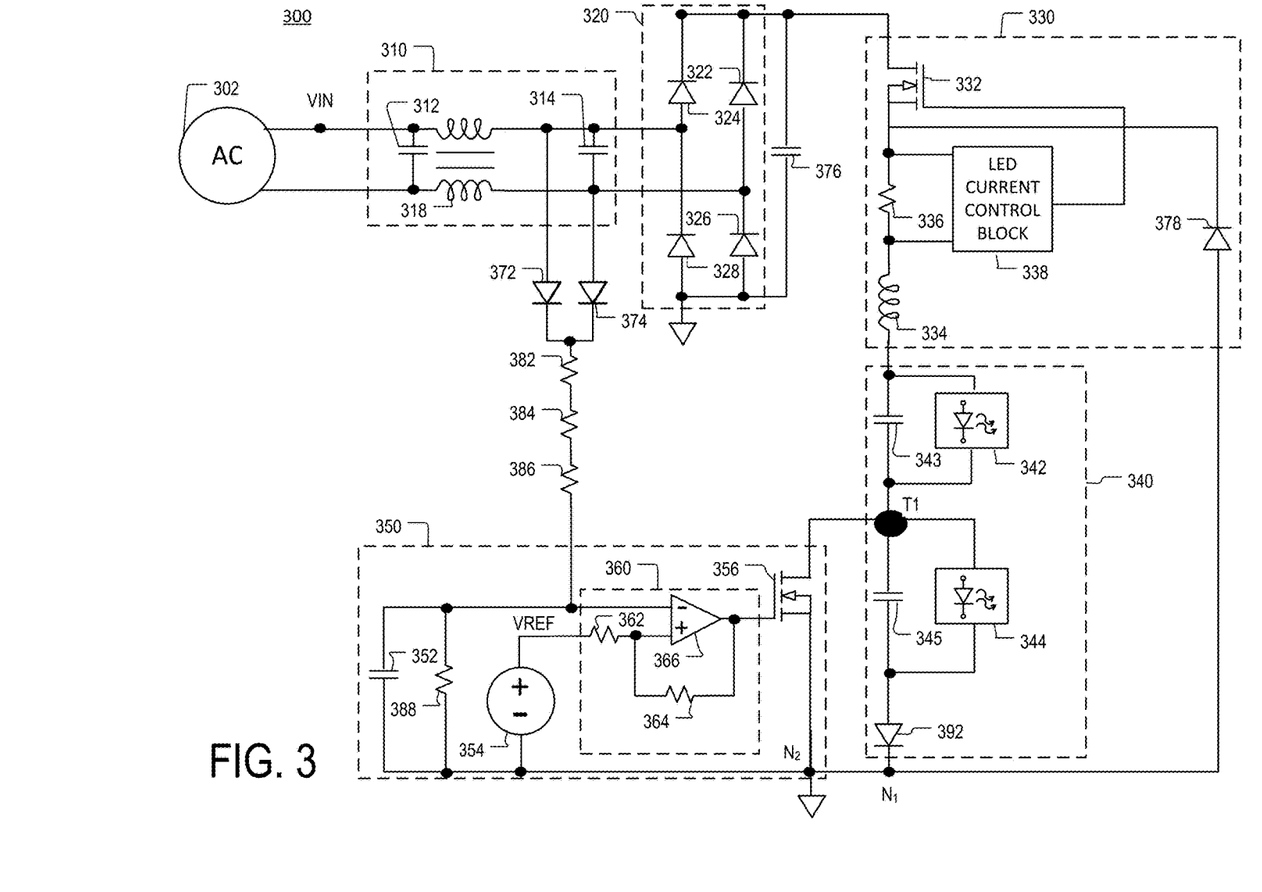
FIG. 3 is a diagram of another example of an LED driver circuit, in accordance with the present disclosure.

FIG. 3 is a diagram of an LED driver 300 that is configured to reduce the duration of interruption periods that occur when a Buck converter section is used to drive a plurality of LEDs. The reduction is achieved by dividing the light sources in the LED driver 300 into sections, and switching the sections on and off in dependence upon the magnitude of instantaneous voltage that is being supplied to the LED driver 300. When the instantaneous voltage is too low to power all sections, one of the sections may be switched off. When the section is switched off, the load that is placed on the Buck converter section may be reduced, which may permit current to continue flowing across Buck converter section and the sections that remain switched on.

The LED driver 300 may include an EMI filter 310 at the AC input side that includes capacitors 312 and 314 and common mode inductor 318, as shown. The EMI filter 310 may receive AC voltage VIN from an AC source 302 and output filtered AC voltage to a rectifier 320. The AC source 302 may include a municipal power main and/or any other suitable source of AC current. Additionally or alternatively, the AC source 302 may include a connector that is adapted to connect to an AC voltage source.

The rectifier 320 may receive the filtered AC voltage from the EMI filter 310 and supply rectified DC voltage to a Buck converter section 330. The rectifier 320 may include any suitable type of rectifier circuit. In some implementations, the rectifier 320 may include diodes 322, 324, 326, and 328, arranged as shown.

The Buck converter section 330 may be a single-stage Buck converter. The Buck converter section 330 may be the same or similar to the Buck converter section 130, which is discussed above with respect to FIG. 1. As illustrated, the Buck converter section 330 may include a MOSFET 332, an inductor 334, a resistor 336, a current control block 338, and a diode 378.

The current control block 338 may be coupled to the gate of the MOSFET 322 as shown. The current control block 338 may be configured to intermittently turn the MOSFET 332 on and off in accordance with a predetermined frequency. When the MOSFET 332 is turned on, current flows through the inductor 334. During this period, the inductor 334 builds up its magnetic energy. When the MOSFET 332 is turned off, the inductor 334 releases the magnetic energy to supply current to the light sources 342 and 344 through the diode 378. The current across the load section 340 can be regulated to required levels by varying the switching pattern of the MOSFET 332 by using the current control block 338. The current ripples due to high-frequency switching can be largely absorbed by capacitor 376 such that most of the ripples do not reach the AC input side of the LED driver 300 to cause EMC issues.

The load section 340 may include the light source 342 coupled in parallel with a capacitor 343 and the light source 344 coupled in parallel with a capacitor 345. The capacitor 343 and 345 are to largely absorb high frequency current ripples. The light source 342 may include one or more LEDs. In some implementations, at least some of the LEDs in the light source 342 may be coupled to one another in series. Additionally or alternatively, in some implementations, at least some of the LEDs in the light source 342 may be coupled to one another in parallel. The light source 344 may include one or more LEDs. In some implementations, at least some of the LEDs in the light source 344 may be coupled to one another in series. Additionally or alternatively, in some implementations, at least some of the LEDs in the light source 344 may be coupled to one another in parallel. In some implementations, the light source 342 may have a threshold voltage of VLED1 (e.g., 30V) and the light source 344 may have a threshold voltage VLED2 (e.g., 30V). The load section 340 may have a combined threshold voltage that is equal to the sum of VLED1 and VLED2 (e.g., 60V).

The light source 344 may be coupled to the light source 342 at a tap point T1. Tap point T1 may be switched on and off by a switching circuit 350. When tap point T1 is switched on, the current output by the Buck converter section 330 flows along the path spanning between the tap point T1 and node N1. In other words, when the tap point T1 is switched on, the current output by the Buck converter section 330 flows across the light source 344 and the light source 344 is turned on as a result. When the tap point T1 is switched off, the current output by the Buck converter section 330 travels along the short conductive path spanning between tap point T1 and node N2 (hereinafter "short conductive path T1-N2") to bypass the light source 344. In other words, when the tap point T1 is switched off, the current output by the Buck converter section 330 is diverted away from the light source 344, and the light source 344 does not place a load on the Buck converter section 330 as a result.

The switching circuit 350 may be configured to switch the tap point T1 on and off based on the magnitude of the instantaneous AC voltage VIN supplied by the AC source 302. The switching circuit 350 may include a capacitor 352 coupled in parallel with a resistor 388 and a voltage source 354, as shown. Furthermore, the switching circuit 350 may include a MOSFET 356 and a voltage comparator 360 that is coupled to the gate of the MOSFET 356. The voltage comparator 360 may include a resistor 362, a feedback resistor 364, and an operational amplifier (hereinafter "opamp") 366. The inverting input of the opamp 366 may be coupled to the voltage source 354 via the resistor 362. The output terminal of the opamp 366 may be coupled to the opamp's 366 non-inverting input via the feedback resistor 364. As can be readily appreciated, the resistor 362 may set the input impedance of the non-inverting terminal of the opamp 366, as well as a hysteresis together with the feedback resistor 364.

According to aspects of the disclosure, the switching circuit 350 may be associated with a particular trip point. The trip point may be a particular value of the input AC voltage VIN at which the switching circuit 350 is configured to switch the tap point T1 on and off. By way of example, the trip point of the switching circuit 350 may equal the threshold voltage of the load section 340. When the magnitude of the instantaneous AC voltage VIN is below the trip point of the switching circuit 350, the switching circuit 350 may cause the MOSFET 356 to close the short conductive path T1-N2, effectively causing the current that is output by the Buck converter section 330 to bypass the light source 344.

When the magnitude of the instantaneous AC voltage VIN is above the trip point of the switching circuit 350, the switching circuit 350 may cause the MOSFET 356 to open the short conductive path T1-N2, causing the current output by the Buck converter section 330 to begin flowing across the light source 344.

In operation, diodes 372 and 374 may rectify the AC input voltage VIN into a DC voltage, which is sensed by a resistor divider including resistor 382, resistor 384, resistor 386, and resistor 388. The voltage across the resistor 388, which represents the instantaneous AC voltage VIN, may be filtered by capacitor 352 and used as the inverting input of the opamp 366. The voltage VREF which is output by the voltage source 354 may be a reference voltage coupled to the non-inverting input of the opamp 366. In some implementations, the reference voltage VREF and the divider ratio of resistor string 382-388 may be dimensioned such that the trip point of the switching circuit 350 is approximately equal the sum of the threshold voltage VLED1 of the light source 342 and the threshold voltage VLED2 of the light source 344. Additionally or alternatively, in some implementations, the reference voltage VREF and the divider ratio of resistor string 382-388 may be dimensioned such that the trip point of the switching circuit 350 is less than or equal to the sum of the threshold voltage VLED1 of the light source 342 and the threshold voltage VLED2 of the light source 344.

When the magnitude of the instantaneous AC voltage VIN is below the trip point of the opamp 366, the output produced by the opamp 366 may be high and the MOSFET 356 may be turned on. When the magnitude of the instantaneous AC voltage VIN is above the trip point of the opamp 366, the output produced by the opamp 366 may be low and the MOSFET 356 may be turned off. As can be readily appreciated, due to the diodes 372 and 374, the switching of the MOSFET 356 is at double the AC input frequency (e.g., 60 Hz). When the MOSFET 356 is switched on, the short conductive path T1-N2 is closed, the tap point T1 is turned off, and the current output from the Buck converter section 330 is diverted away from the light source 344.

According to aspects of the disclosure, the diode 392 ensures that turning on the MOSFET 356 provides a conductive path for the light source 342 without short-circuiting the light source 344 and/or the capacitor 345. In some implementations, the diode 392 can be replaced by an active switching device that turns on when the MOSFET 356 is off and turns off when the MOSFET 356 is on. The latter approach may increase the efficiency of the LED driver 300 at the expense of increased circuit complexity and increased manufacturing cost.

In some implementations, the voltage comparator 360 (or opamp 366) may be configured to operate the MOSFET 356 in ohmic mode for increased efficiency. This is in contrast to traditional tapped linear drivers which normally control their constituent taps by using MOSFETs that are operated in linear mode with more power dissipation.

Furthermore, it should be noted that in the LED driver 300, output current control is performed independently of the switching of taps in the load section 340. As illustrated above, in the LED driver 300, output current control is performed by the current control block 338, which controls the rate and pattern at which the MOSFET 332 is switched on and off. Because switching the tap point T1 by the circuit 350 occurs only during periods of low magnitude of the instantaneous AC voltage, it hardly affects the total value and the control of the output current. This, in turn, facilitates the use of the LED driver 300 and/or the Buck converter section 330 together with various dimmer switches that are available on the market. As can be readily appreciated, if output current control and tap switching were performed co-dependently, the introduction of a dimmer switch could potentially require a more complicated output current control depending on the manner in which taps are switched.

Furthermore, as illustrated above, the AC input voltage sensing of switching circuit 350 may be coupled to the AC source 302 before the rectifier 320. This, in turn, may allow the switching circuit 350 to switch the tap point T1 at precise points in the waveform of the input voltage VIN for optimum performance. Such precise switching might not be possible if the AC input voltage sensing of circuit 350 were coupled after (or downstream from) the rectifier 320 due to attenuation and/or distortion introduced by the rectifier 320 and the capacitor 376. Notwithstanding, it should be noted that the disclosure is not limited to any specific position of the switching circuit 350, and the AC input voltage sensing of switching circuit 350 may nonetheless be situated downstream from the rectifier 320 in some implementations.

Figure 4:
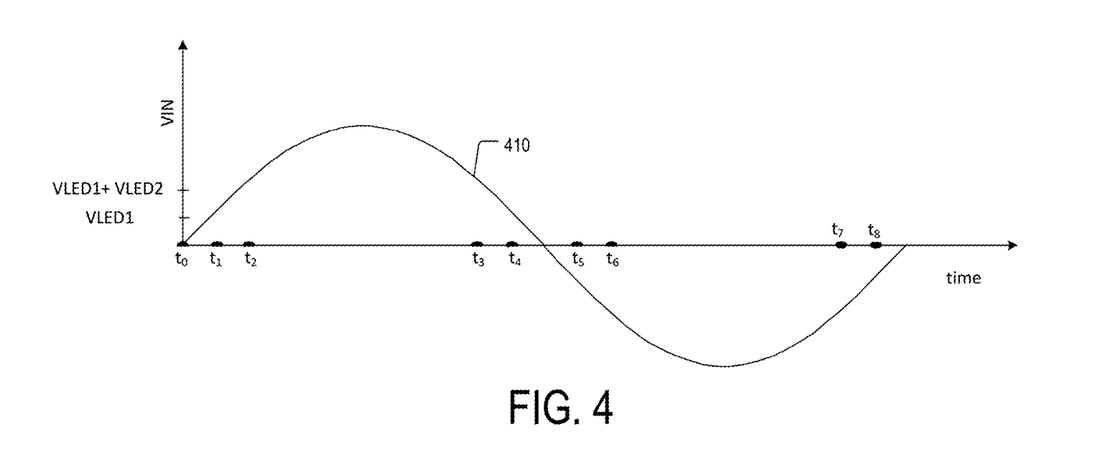
FIG. 4 is a graph illustrating an example of a voltage waveform that can be used to power the LED driver circuit of FIG. 3, in accordance with the present disclosure.
Figure 5:
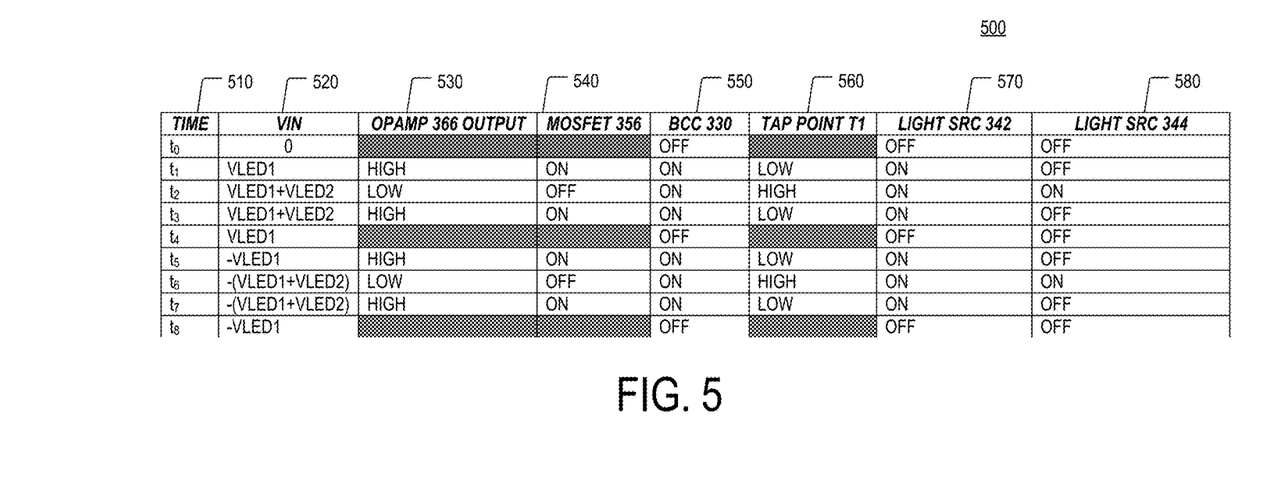
FIG. 5 is a table illustrating aspects of the operation of the LED driver circuit of FIG. 3, in accordance with the present disclosure.

The operation of the LED driver 300 is described in further detail with reference to FIGS. 4 and 5. Shown in FIG. 4 is a graph of a waveform 410 of the AC voltage VIN that is supplied to the LED driver 300 by the AC source 302. FIG. 5 shows a table 500 identifying the states undergone by the LED driver 300 during each cycle of the waveform 410. The table 500 includes columns 510-580. Column 510 identifies a plurality of different time instants. Column 520 identifies the magnitude of the instantaneous AC voltage VIN supplied by the AC source 302 at each of the time instants of column 510. Column 530 identifies the state of the opamp 366 output at each of the time instants of column 510. Column 540 identifies the state of the MOSFET 356 at each of the time instants of column 510. Column 550 identifies the state of the Buck converter section 330 at each of the time instants of column 510. Column 560 identifies the state of the tap point T1 at each of the time instants of column 510. Column 570 identifies the state of the light source 342 at each of the time instants of column 510. Column 580 identifies the state of the light source 344 at each of the time instants of column 510.

At time $t_0$, the magnitude of the instantaneous AC voltage VIN is zero, below the threshold voltage VLED1 of the light source 342. As a result, the Buck converter is turned off. At this time, the state of the opamp 366 and the MOSFET 356 is irrelevant because no current can be output from the Buck converter section 330. The light sources 342 and 344 may be turned off, or alternatively, the light sources 342 and 344 may be powered using energy stored in capacitors 343 and 345, respectively.

At time $t_1$, the magnitude of the instantaneous AC voltage VIN exceeds the threshold voltage VLED1 of the light source 342. Furthermore, the opamp 366 output generates a high signal, which causes the MOSFET 356 to be turned on to close the short conductive path T1-N2 and turn off the tap point T1. As a result, the Buck converter section (BCC) 330 is turned on. At this time, the light source 342 may be powered with current output from the Buck converter section 330. The light source 344, on the other hand, may not receive the current generated by the Buck converter section 330 and it may be either turned off or powered using energy stored in the capacitor 345.

At time $t_2$, the magnitude of the instantaneous AC voltage VIN exceeds the sum of the threshold voltage VLED1 of the light source 342 and the threshold voltage VLED2 of the light source 344. In response, the opamp 366 output generates a low signal, and the MOSFET 356 is turned off. When the MOSFET 356 is turned off, the short conductive path T1-N2 is opened, allowing current supplied by the Buck converter section 330 to flow across the light source 344. At this time, the tap point T1 is turned on and both of the light sources 342 and 344 may be supplied with current that is output from the Buck converter section 330.

At time $t_3$, the magnitude of the instantaneous AC voltage VIN falls below the sum of the threshold voltage VLED1 of the light source 342 and the threshold voltage VLED2 of the light source 344, while still above the threshold voltage VLED1 of the light source 342. In response, the opamp 366 output generates a high signal, which causes the MOSFET 356 to be turned on to close the short conductive path T1-N2 and turn off the tap point T1. At this time, the light source 342 may be powered with current output from the Buck converter section 330. The light source 344, on the other hand, may not receive the current generated by the Buck converter section 330 and it may be either turned off or powered using energy stored in the capacitor 345.

At and after time $t_4$ and before time $t_5$, the magnitude of the instantaneous AC voltage VIN falls below the threshold voltage VLED1 of the light source 342. As a result, the Buck converter is turned off. At this time, the state of the opamp 366 and the MOSFET 356 is irrelevant because no current can be output from the Buck converter section 330. The light sources 342 and 344 may be turned off, or alternatively, the light sources 342 and 344 may be powered using energy stored in capacitors 343 and 345, respectively.

At time $t_5$, the magnitude of the instantaneous AC voltage VIN exceeds the threshold voltage VLED1 of the light source 342. Furthermore, the opamp 366 output generates a high signal, which causes the MOSFET 356 to be turned on to close the short conductive path T1-N2 and turn off the tap point T1. As a result, the Buck converter section 330 is turned on. At this time, the light source 342 may be powered with current output from the Buck converter section 330. The light source 344, on the other hand, may not receive the current generated by the Buck converter section 330 and it may be either turned off or powered using energy stored in the capacitor 345.

At time $t_6$, the magnitude of the instantaneous AC voltage VIN exceeds the sum of the threshold voltage VLED1 of the light source 342 and the threshold voltage VLED2 of the light source 344. In response, the opamp 366 output generates a low signal, and the MOSFET 356 is turned off. When the MOSFET 356 is turned off, the short conductive path T1-N2 is opened, allowing current supplied by the Buck converter section 330 to flow across the light source 344. At this time, the tap point T1 is turned on and both of the light sources 342 and 344 may be supplied with current that is output from the Buck converter section 330.

At time $t_7$ the magnitude of the instantaneous AC voltage VIN falls below the sum of the threshold voltage VLED1 of the light source 342 and the threshold voltage VLED2 of the light source 344, while still above the threshold voltage VLED1 of the light source 342. In response, the opamp 366 output generates a high signal, which causes the MOSFET 356 to be turned on to close the short conductive path T1-N2 and turn off the tap point T1. At this time, the light source 342 may be powered with current output from the Buck converter section 330. The light source 344, on the other hand, may not receive the current generated by the Buck converter section 330 and it may be either turned off or powered using energy stored in the capacitor 345.

At and after time $t_8$, the magnitude of the instantaneous AC voltage VIN falls below the threshold voltage VLED1 of the light source 342. As a result, the Buck converter is turned off. At this time, the state of the opamp 366 and the MOSFET 356 is irrelevant because no current can be output from the Buck converter section 330. The light sources 342 and 344 may be turned off, or alternatively, the light sources 342 and 344 may be powered using energy stored in capacitors 343 and 345, respectively.

Figure 6:
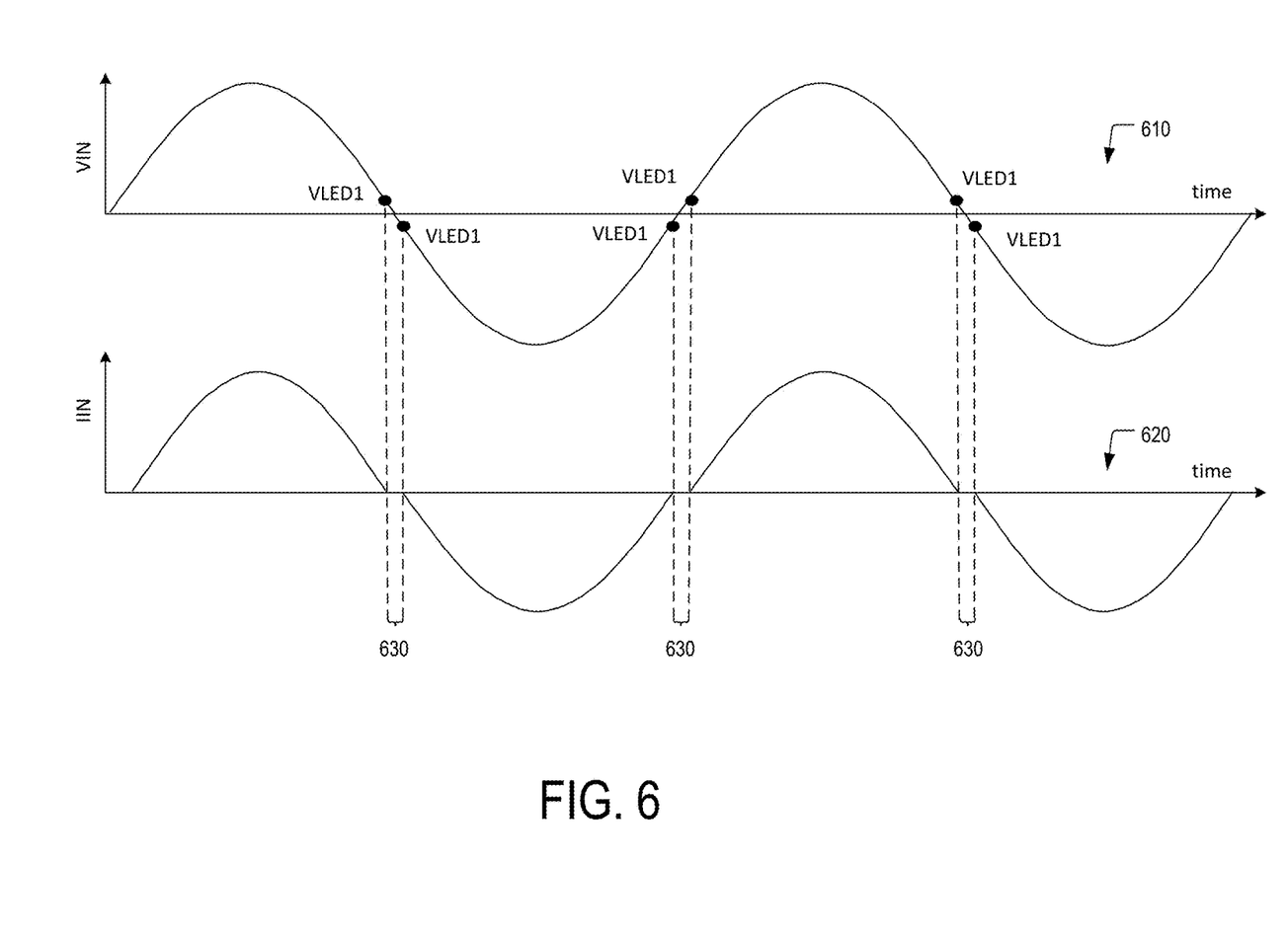
FIG. 6 is graph illustrating aspects of the operation of the LED driver circuit of FIG. 3, in accordance with the present disclosure.

FIG. 6 includes plots 610 and 620 which illustrate a pattern at which interruption periods 630 occur during normal operation of the LED driver 300. Plot 610 shows the input AC voltage VIN, which is supplied to the LED driver 300 by the AC source 302, as a function of time. Plot 620 shows the input current IIN that is supplied to the LED driver 300 by the AC source 302. As illustrated by the plot 620, the flow of the input current IIN is interrupted during interruption periods 630. However, because the LED driver 300 utilizes a switching circuit 350 to dynamically disconnect the light source 344 from the Buck converter section 330 when the magnitude of the instantaneous AC voltage VIN is too low to power both of the light sources 342 and 344, the duration of the interruption periods 630 of the LED driver 300 is twice as short as the duration of the interruption periods 230 of the LED driver 100 as illustrated in FIG. 2. As a result, at 120V/60 Hz input, the total harmonic distortion (THD) of input current may be approximately 20% for the LED driver 100, and approximately 11% for the LED driver 300. This reduction in THD is significant, and it could make practical the use of single-stage Buck converter sections to drive LED-based light fixtures that require a high quality of both input current and light output.

Figure 7A:
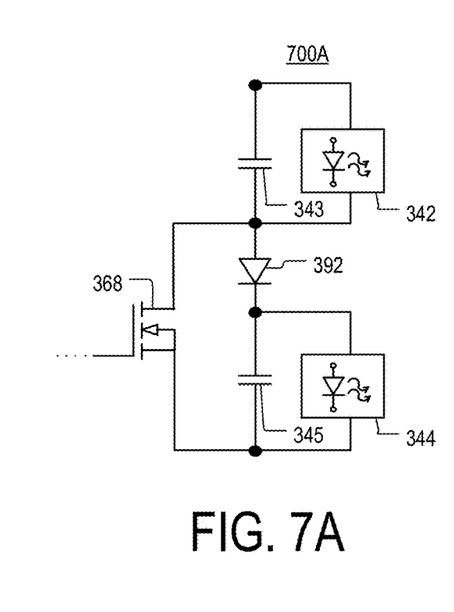
FIG. 7A is a diagram of an example of a load section that can be substituted into the LED driver circuit of FIG. 3, in accordance with the present disclosure.

FIG. 7A is a diagram illustrating an example a load section 700A that can be used to replace the load section 340 of the LED driver 300. The load section 700A may include the light source 342 coupled in parallel with the capacitor 343 and the light source 344 coupled in parallel with the capacitor 345. The diode 392 may be disposed between the light sources 342 and 344. The MOSFET 368 may be coupled in parallel with the diode 392 and the light source 344, as shown.

Figure 7B:
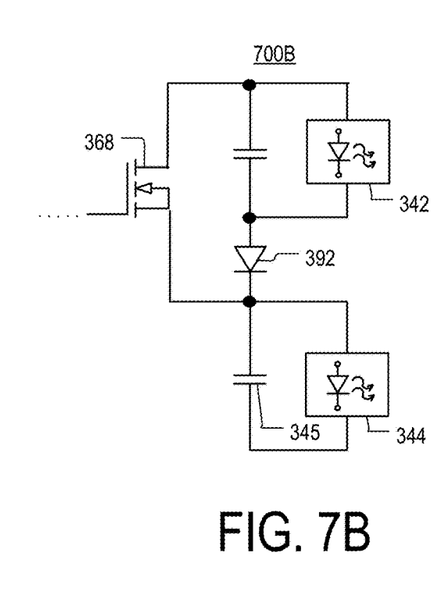
FIG. 7B is a diagram of another example of a load section that can be substituted into the LED driver circuit of FIG. 3, in accordance with the present disclosure.

FIG. 7B is a diagram illustrating an example a load section 700B that can be used to replace the load section 340 of the LED driver 300. The load section 700B may include the light source 342 coupled in parallel with the capacitor 343 and the light source 344 coupled in parallel with the capacitor 345. The diode 392 may be disposed between the light sources 342 and 344. The MOSFET 368 may be coupled in parallel with the diode 392 and the light source 342, as shown.

Figure 7C:
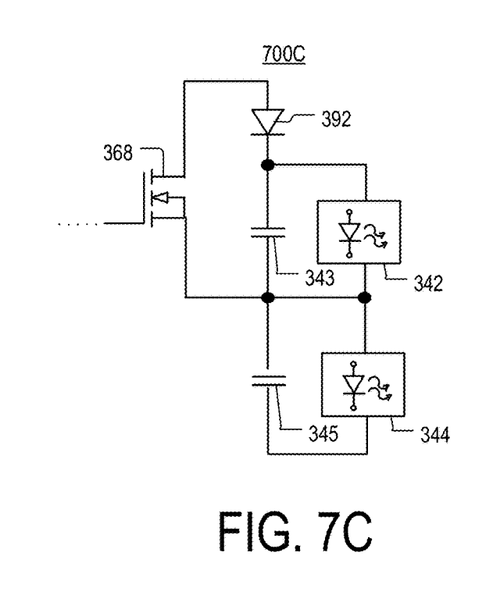
FIG. 7C is a diagram of yet another example of a load section that can be substituted into the LED driver circuit of FIG. 3, in accordance with the present disclosure.

FIG. 7C is a diagram illustrating an example a load section 700C that can be used to replace the load section 340 of the LED driver 300. The load section 700C may include the light source 342 coupled in parallel with the capacitor 343 and the light source 344 coupled in parallel with the capacitor 345. The diode 392 may be disposed upstream from both of the light sources 342 and 344. The MOSFET 368 may be coupled in parallel with the diode 392 and the light source 342, as shown.

Figure 8:
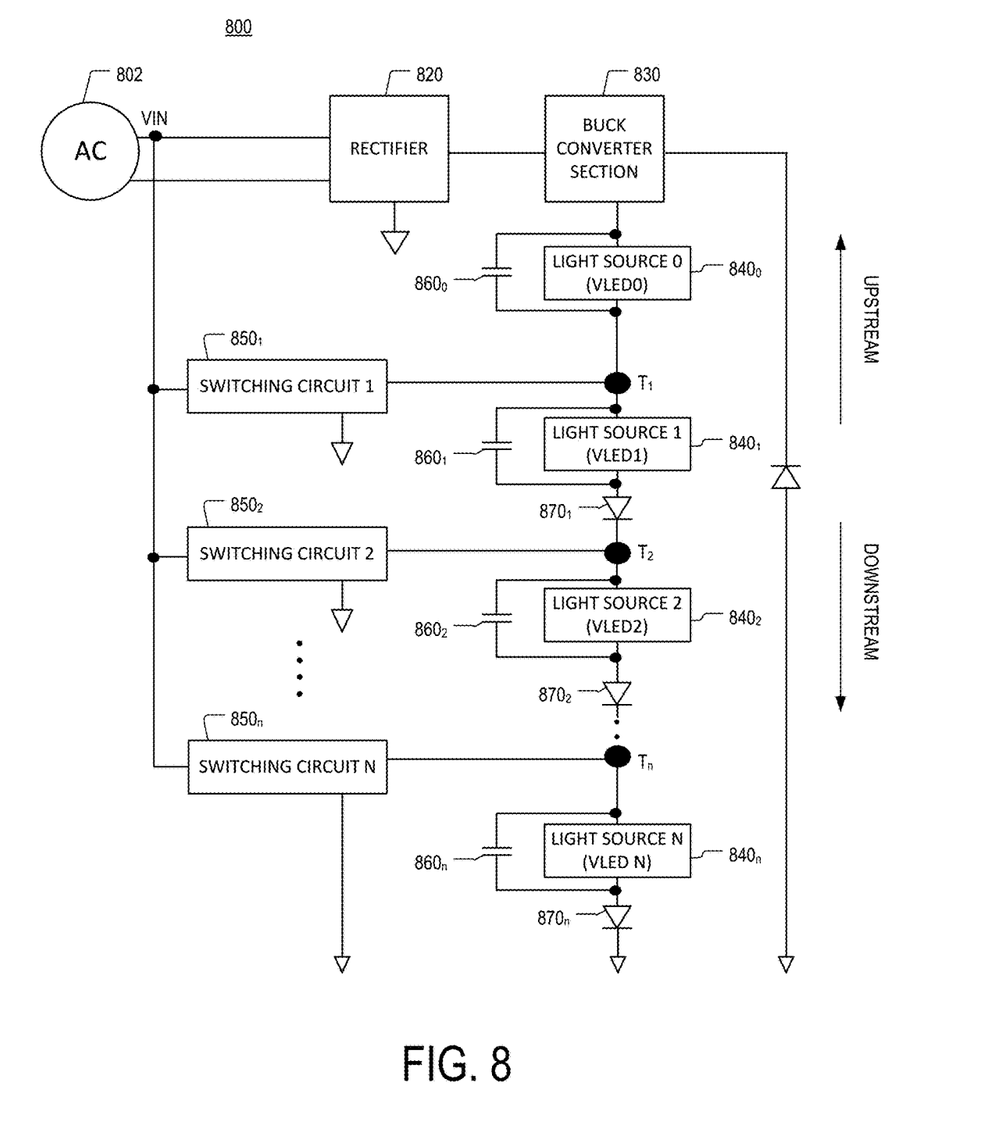
FIG. 8 is a diagram of yet another example of an LED driver circuit, in accordance with the present disclosure.

FIG. 8 is a diagram of an example of an LED driver 800. The LED driver 800 is similar to the LED driver 300. FIG. 8 is provided to illustrate that the concept of the LED driver 300 can be extended to circuits that include multiple tap points $T_{1-n}$, multiple switching circuits $850_{1-n}$, and more than two light sources $840_{1-n}$.

As illustrated, the LED driver 800 may include an AC source 802, a rectifier 820, a Buck converter section 830, a plurality of light sources $840_{0-n}$, and a plurality of switching circuits $850_{1-n}$, wherein n is any positive integer. The AC source 802 may be the same or similar to the AC source 302 of the LED driver 300. The rectifier 820 may be the same or similar to the rectifier 320 of the LED driver 300. The Buck converter section 830 may be the same or similar to Buck converter section 330 of the LED driver 300. The light sources $840_{0-n}$ may be LED-based light sources. Each of the light sources $840_{0-n}$ may be the same or similar to any of the light sources 342 and 344. Each light source $840_i$ may have a respective threshold voltage $VLED_i$, wherein $0 \leq i \leq n$. For example, the light source $840_0$ may have a threshold voltage $VLED_i$, the light source $840_1$ my a have threshold voltage $VLED_1$, the light source $840_2$ may have a threshold voltage $VLED_2$, and the light source $840_n$ may have threshold voltage $VLED_n$.

The light sources $840_{1-n}$ may be coupled to one another via tap points $T_{1-n}$. Each of the light sources $840_{1-n}$ may be coupled in parallel with a respective capacitor $860_{1-n}$ that is configured to absorb high-frequency current ripples. In addition, each of the light sources $840_{1-n}$ may be coupled in series with a respective diode $870_{1-n}$. As discussed above, in some implementations, each diode $870_i$ may be replaced with a switching device that is configured to be turned off when the respective tap $T_i$ is turned off.

Except for light source $840_0$, each light source $840_k$ may be coupled to the Buck converter section 830 via a respective tap point $T_k$ that is situated immediately upstream from the light source $840_k$, wherein $1 \leq k \leq n$. Each tap point $T_k$ may be switched on and off by a respective switching circuit $850_k$. When any given tap point $T_k$ is switched on, current supplied by the Buck converter section 830 is routed across the light source $840_k$. When any given tap point $T_k$ is switched off, current supplied by the Buck converter section 830 is diverted over a short conductive path, such as the path T1-N2 discussed with respect to FIG. 3, to bypass the light source $840_k$ and all remaining light sources $840_{(k+1)-n}$ that are situated downstream from the light source $840_k$. When any given tap point $T_k$ is switched off, the light source $840_k$ and all remaining light sources $840_{(k+1)-n}$ that are situated downstream from the light source $840_k$ may not be powered with current supplied by the Buck converter section 830 and may not place a load on the Buck converter section 830, but may be powered using energy stored in capacitors $860_{0-n}$.

In some implementations, each switching circuit $850_k$ may be the same or similar to the switching circuit 350 of the LED driver 300. Each switching circuit $850_k$ may be configured to switch off its corresponding tap point $T_k$ when the magnitude of the instantaneous AC voltage VIN that is supplied by the AC source 802 is less than (or equal) to a trip point $TP_k$ corresponding to the switching circuit $850_k$. Additionally or alternatively, each switching circuit $850_k$ may be configured to switch on its corresponding tap point $T_k$, when the magnitude of the instantaneous AC voltage VIN that is supplied by the AC source 802 is greater than (or equal) to a trip point $TP_k$ corresponding to the switching circuit $850_k$.

The trip point of any switching circuit $850_k$ may be less than or equal to the sum of the voltage threshold of the light source $840_k$ and the voltage thresholds of all light sources that are situated upstream from the tap point $T_k$ that is associated with the switching circuit $850_k$. In some implementations, the trip point $TP_k$ of any switching circuit $850_k$ may be calculated using Equation 1 below:

$$TP_k \leq \Sigma_{i=0}^{k} VLED_i \qquad \text{(Eq. 1)}$$

FIGS. 1-8 are provided as an example only. At least some of the elements discussed with respect to these figures can be arranged in different order, combined, and/or altogether omitted. It will be understood that the provision of the examples described herein, as well as clauses prefaced with "such as," "e.g.", "including", "in some aspects," "in some implementations," and the like should not be interpreted as limiting the disclosed subject matter to the specific examples.

Although in the above examples, the Buck converter sections, and the switching circuits use MOSFETs as they are primary switching devices, alternative implementations are possible in which another type of switching device can be used. More particularly, any of the MOSFETs discussed in the specification (e.g., MOSFET 332 or MOSFET 368) may be replaced with a binary junction transistor (BJT) or any other suitable type of switching device. Furthermore, although in the present example, the voltage comparator 360 is implemented as a non-inverting comparator circuit, any other suitable type of voltage comparator may be used instead. The present disclosure is thus not limited to any specific type of voltage comparator. Furthermore, the Buck converter sections discussed in the disclosure are single-stage Buck converter sections. Although the disclosure is particularly advantageous when used in conjunction with single-stage Buck converter sections, alternative implementations are possible in which multi-stage Buck converter sections are used instead.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is claimed is:

1. An integrated light emitting diode (LED) lighting system comprising:
    an alternating current (AC) input;
    a load circuit comprising:
        at least a first plurality of LED devices coupled in parallel with a first capacitor and a second plurality of LED devices coupled in parallel with a second capacitor, the at least the first plurality of LED devices and the second plurality of LED devices being coupled together at a tap point, and
        a diode coupled in series with at least the first and second capacitors on a first electrical path between the tap point and a first node;
    a single stage buck converter circuit, electrically coupled between the AC input and the first plurality of LED devices, configured to provide a drive current to the load circuit; and
    a switching circuit on a second electrical path between the tap point and a second node, the switching circuit comprising an input electrically coupled to a second location between the AC input and the single stage buck converter circuit to sense an instantaneous voltage of the sinusoidal input voltage and configured to close the second electrical path to divert the drive current away from the second plurality of LED devices along the second electrical path when the instantaneous voltage is less than a threshold voltage of the load circuit and to open the second electrical path when the instantaneous voltage is greater than the threshold voltage of the load circuit.

2. The system of claim 1, wherein the switching circuit comprises a switch coupled to the tap point and a comparator coupled to the switch, and the comparator is configured to switch the switch to an on state to disconnect the second plurality of LED devices from the drive current in response to the instantaneous voltage dropping below the threshold voltage of the load circuit.

3. The system of claim 1, further comprising a rectifier element coupled to the single stage buck converter circuit.

4. The system of claim 1, wherein the threshold voltage of the load circuit equals a total threshold voltage of the first and second plurality of LED devices.

5. The system of claim 1, wherein each of the first plurality of LED devices and the second plurality of LED devices comprises a plurality of LED devices electrically coupled together in at least one of in series and in parallel.

6. The system of claim 1, wherein the switching circuit comprises a plurality of switching circuits, and the load circuit comprises a plurality of tap points and more than two pluralities of LED devices.

7. A method comprising:
receiving an alternating current (AC);
converting the AC to a direct current (DC) using a single stage buck converter circuit;
supplying the DC from the single stage buck converter circuit to a series string of a first plurality of LED devices and a second plurality of LED devices, the first plurality of LED devices and the second plurality of LED devices being coupled together at a tap point on a first electrical path; and
maintaining a switch, on a second electrical path between a tap point between the first plurality of LED devices and the second plurality of LED devices and a node, in an ON state to close the second electrical path and divert the DC current along the second electrical path to by-pass the second plurality of LED devices when a voltage level of the AC is below a threshold voltage of the first and second plurality of LED devices;
sensing an instantaneous voltage of the sinusoidal input voltage at a location between the AC input and the single stage buck converter circuit;
maintaining a switch in an OFF state to open the second electrical path when the instantaneous voltage is greater than the threshold voltage of the load circuit; and
supplying the second plurality of LEDs with a current from an alternate source when the DC current is diverted.

8. The method of claim 7, wherein the diverting the DC current further comprises diverting the DC current on a condition that the instantaneous voltage is between a threshold voltage of the first plurality of LED devices and the threshold voltage of the series string of the first plurality of LED devices and the second plurality of LED devices.

9. The method of claim 7, wherein the current from the alternate source is supplied by a capacitor.

10. The method of claim 7, wherein the diverting the DC current does not short the first and second plurality of LED devices.

11. The system of claim 1, wherein the threshold voltage of the load circuit is constant.

12. The method of claim 7, wherein the threshold voltage is constant.

* * * * *